(12) United States Patent
Minervini

(10) Patent No.: US 7,439,616 B2
(45) Date of Patent: Oct. 21, 2008

(54) MINIATURE SILICON CONDENSER MICROPHONE

(75) Inventor: Anthony D. Minervini, Palos Hill, IL (US)

(73) Assignee: Knowles Electronics, LLC, Itasca, IL (US)

( * ) Notice: Subject to any disclaimer, the term of this patent is extended or adjusted under 35 U.S.C. 154(b) by 261 days.

(21) Appl. No.: 11/276,025

(22) Filed: Feb. 10, 2006

(65) Prior Publication Data

US 2006/0157841 A1 Jul. 20, 2006

Related U.S. Application Data

(60) Continuation-in-part of application No. 11/112,043, filed on Apr. 22, 2005, now Pat. No. 7,242,089, which is a division of application No. 09/886,854, filed on Jun. 21, 2001, now Pat. No. 7,166,910.

(60) Provisional application No. 60/253,543, filed on Nov. 28, 2000.

(51) Int. Cl.
*H01L 23/12* (2006.01)
*H01L 21/00* (2006.01)
*H04R 9/08* (2006.01)
*H04R 31/00* (2006.01)

(52) U.S. Cl. .................. 257/704; 257/729; 257/730; 381/361; 438/125; 438/623; 29/594; 29/609.1

(58) Field of Classification Search .................. None
See application file for complete search history.

(56) References Cited

U.S. PATENT DOCUMENTS

| 4,127,840 | A | 11/1978 | House |
| 4,277,814 | A | 7/1981 | Giachino et al. |
| 4,314,226 | A | 2/1982 | Oguro et al. |
| 4,533,795 | A | 8/1985 | Baumhauer, Jr. et al. |
| 4,628,740 | A | 12/1986 | Ueda et al. |
| 4,737,742 | A | 4/1988 | Takoshima et al. |
| 4,776,019 | A | 10/1988 | Miyatake |
| 4,825,335 | A | 4/1989 | Wilner |
| 4,908,805 | A | 3/1990 | Sprenkels et al. |
| 4,910,840 | A | 3/1990 | Sprenkels et al. |

(Continued)

FOREIGN PATENT DOCUMENTS

EP 0 077 615 A1 4/1983

(Continued)

OTHER PUBLICATIONS

European Search Report for Application No. 07702957.4 dated Jul. 19, 2007.

(Continued)

*Primary Examiner*—Alonzo Chambliss
(74) *Attorney, Agent, or Firm*—Marshall, Gerstein & Borun LLP

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

21 Claims, 14 Drawing Sheets

U.S. PATENT DOCUMENTS

| | | | |
|---|---|---|---|
| 5,101,543 | A | 4/1992 | Cote et al. |
| 5,101,665 | A | 4/1992 | Mizuno et al. |
| 5,146,435 | A | 9/1992 | Bernstein |
| 5,151,763 | A | 9/1992 | Marek et al. |
| 5,178,015 | A | 1/1993 | Loeppert et al. |
| 5,257,547 | A | 11/1993 | Boyer |
| 5,357,807 | A | 10/1994 | Guckel et al. |
| 5,408,731 | A | 4/1995 | Berggvist et al. |
| 5,449,909 | A | 9/1995 | Kaiser et al. |
| 5,452,268 | A | 9/1995 | Bernstein |
| 5,459,368 | A | 10/1995 | Onishi et al. |
| 5,477,008 | A | 12/1995 | Pasqualoni et al. |
| 5,490,220 | A | 2/1996 | Loeppert |
| 5,506,919 | A | 4/1996 | Roberts |
| 5,531,787 | A | 7/1996 | Lesinski et al. |
| 5,545,912 | A | 8/1996 | Ristic et al. |
| 5,592,391 | A | 1/1997 | Muyshondt et al. |
| 5,593,926 | A | 1/1997 | Fujihira |
| 5,659,195 | A | 8/1997 | Kaiser et al. |
| 5,712,523 | A * | 1/1998 | Nakashima et al. ..... 310/313 R |
| 5,740,261 | A | 4/1998 | Loeppert et al. |
| 5,748,758 | A | 5/1998 | Menasco, Jr. et al. |
| 5,831,262 | A | 11/1998 | Greywall et al. |
| 5,852,320 | A | 12/1998 | Ichihashi et al. |
| 5,870,482 | A | 2/1999 | Loeppert et al. |
| 5,889,872 | A | 3/1999 | Sooriakumar et al. |
| 5,923,995 | A | 7/1999 | Kao et al. |
| 5,939,968 | A | 8/1999 | Nguyen et al. |
| 6,012,335 | A | 1/2000 | Bashir et al. |
| 6,078,245 | A | 6/2000 | Fritz et al. |
| 6,108,184 | A | 8/2000 | Minervini et al. |
| 6,136,419 | A | 10/2000 | Fasano et al. |
| 6,191,928 | B1 | 2/2001 | Rector et al. |
| 6,282,072 | B1 | 8/2001 | Minervini et al. |
| 6,439,869 | B1 | 8/2002 | Seng et al. |
| 6,522,762 | B1 | 2/2003 | Mullenborn et al. |
| 6,594,369 | B1 | 7/2003 | Une |
| 6,621,392 | B1 | 9/2003 | Volant et al. |
| 6,781,231 | B2 * | 8/2004 | Minervini ................... 257/704 |
| 7,003,127 | B1 | 2/2006 | Sjursen et al. |
| 7,080,442 | B2 * | 7/2006 | Kawamura et al. ............ 29/594 |
| 7,166,910 | B2 * | 1/2007 | Minervini ................... 257/704 |
| 7,242,089 | B2 * | 7/2007 | Minervini ................... 257/704 |
| 7,381,589 | B2 * | 6/2008 | Minervini ................... 438/113 |
| 2002/0067663 | A1 | 6/2002 | Loeppert et al. |
| 2002/0102004 | A1 | 8/2002 | Minervini |
| 2003/0052404 | A1 | 3/2003 | Thomas |
| 2003/0133588 | A1 | 7/2003 | Pedersen |
| 2004/0032705 | A1 | 2/2004 | Ma |
| 2004/0184632 | A1 | 9/2004 | Minervini |
| 2005/0018864 | A1 | 1/2005 | Minervini |
| 2005/0069164 | A1 | 3/2005 | Muthuswamy et al. |
| 2005/0185812 | A1 | 8/2005 | Minervini |

FOREIGN PATENT DOCUMENTS

| | | |
|---|---|---|
| EP | 0 774 888 A2 | 5/1997 |
| FI | 981413 | 12/1999 |
| JP | 07-099420 | 4/1995 |
| JP | 09-107192 | 4/1997 |
| JP | 09-318650 | 12/1997 |
| JP | 2000-165999 | 6/2000 |
| JP | 2000-277970 | 10/2000 |
| JP | 2000-316042 | 11/2000 |
| WO | WO-01/19133 A1 | 3/2001 |
| WO | WO-02/15636 A2 | 2/2002 |
| WO | WO-02/45463 A2 | 6/2002 |
| WO | WO-2006/020478 A1 | 2/2006 |
| WO | WO-2006/061058 A1 | 6/2006 |

OTHER PUBLICATIONS

Scheeper, P.R. et al., "A Review of Silicon Microphones", Sensor and Actuators Actuators, A 44 (1994) pp. 1-11.

Rosenberger, M.E., "Absolute Pressure Transducer for Turbo Application", 820320, pp. 77-79.

Notice of Investigation, Inv. No. 337-TA-629, in the Matter of "Certain Silicon Microphone Packages and Products Containing the Same", United States International Trade Commission, issued Jan. 3, 2008.

* cited by examiner

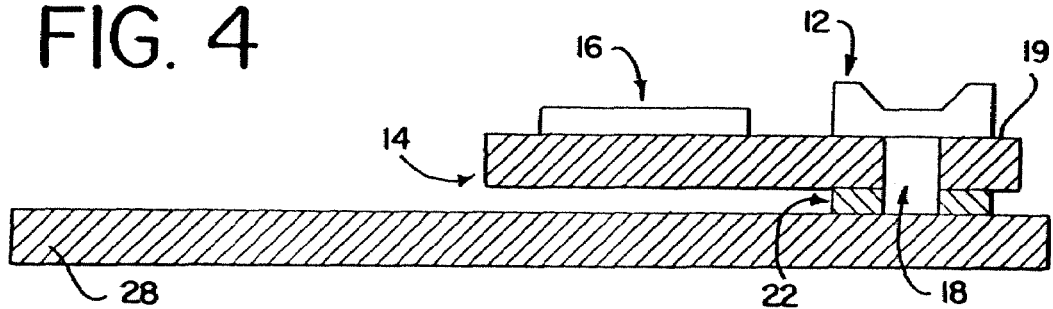
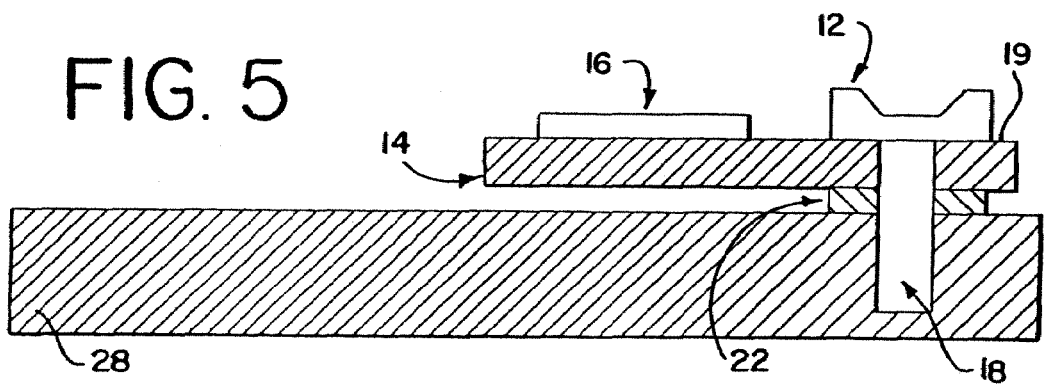
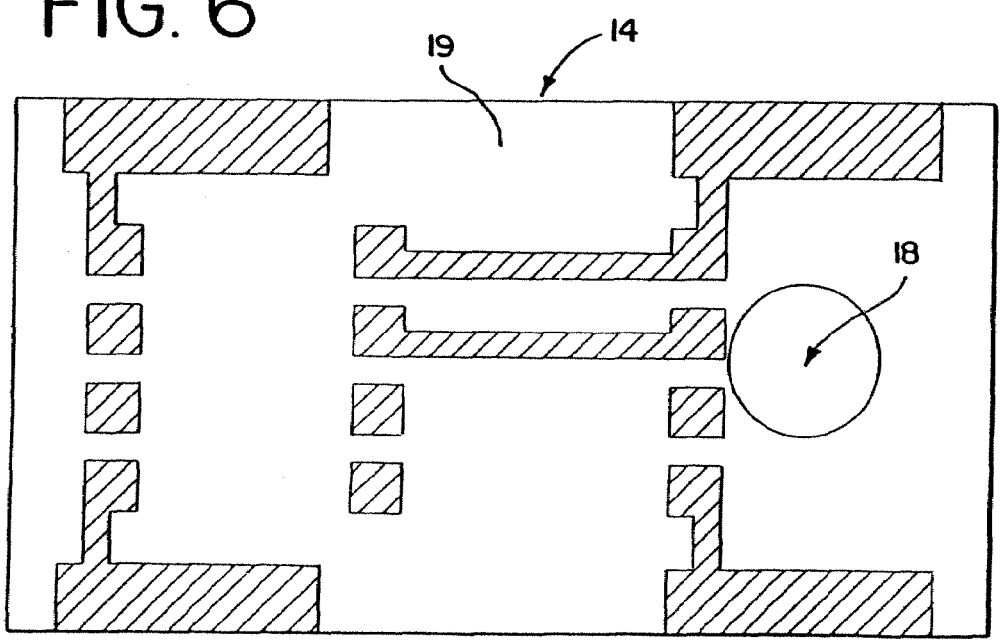

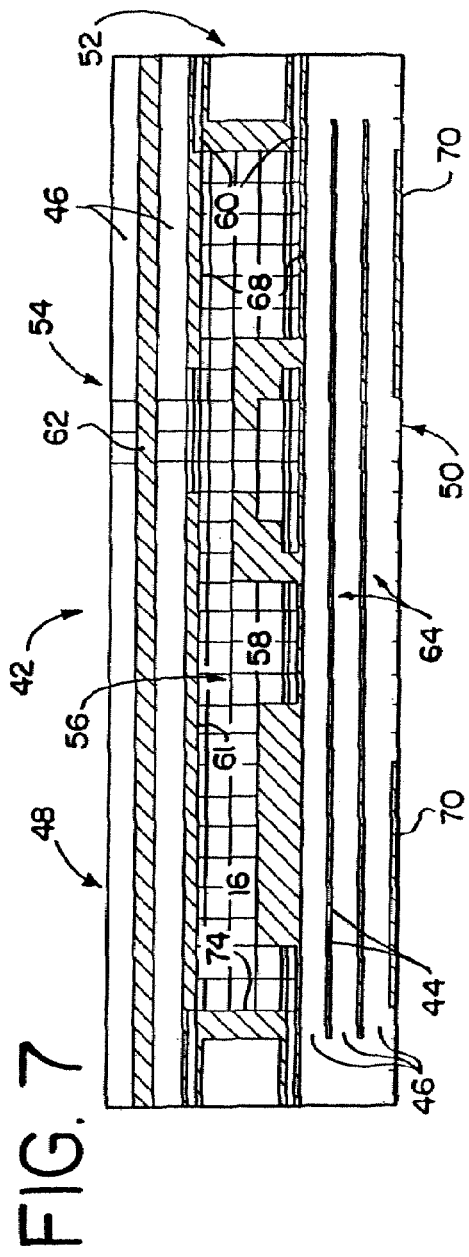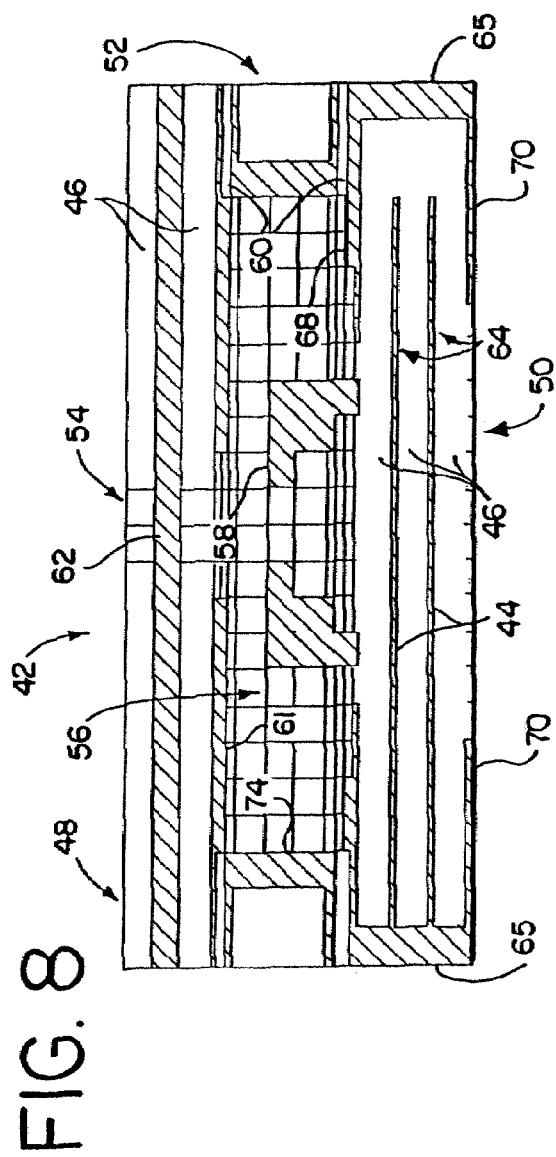

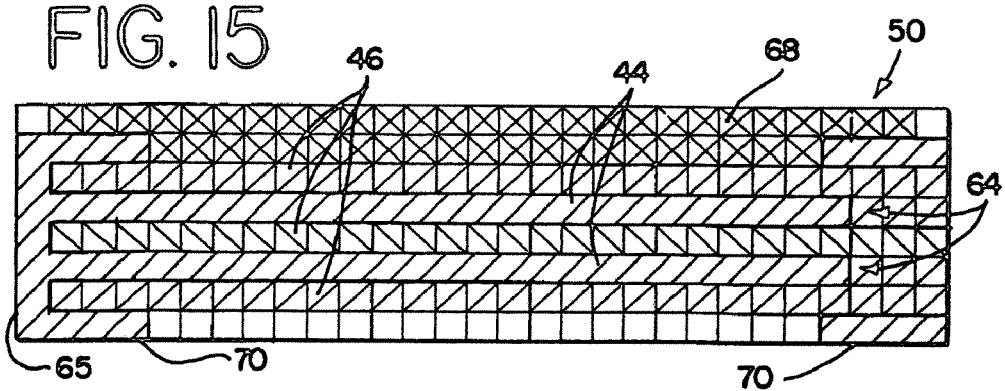
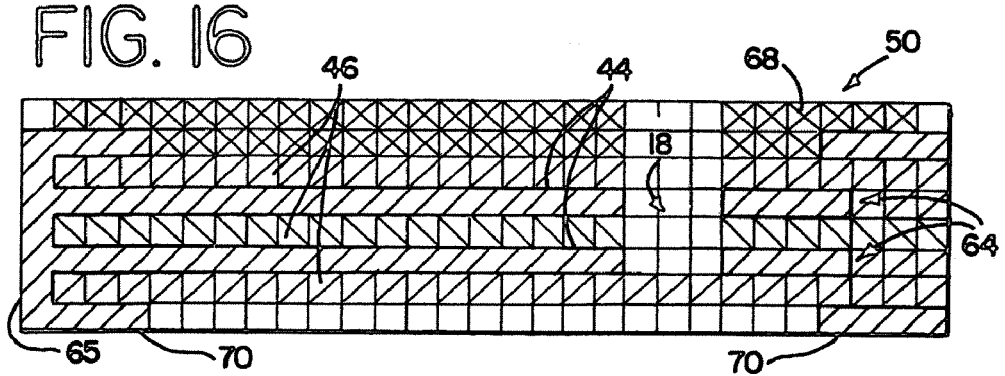
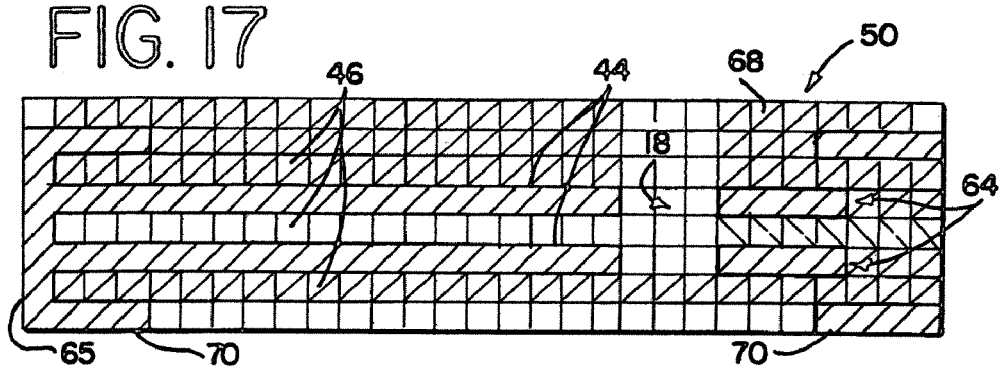
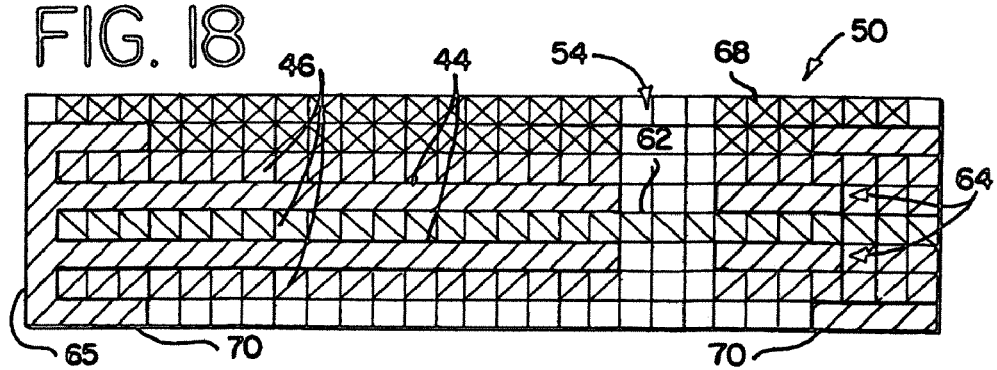

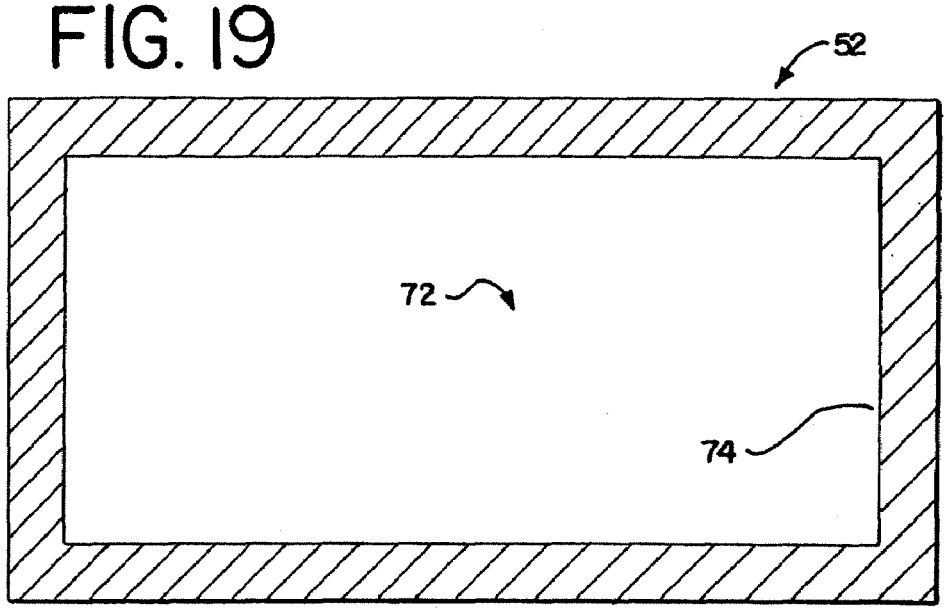
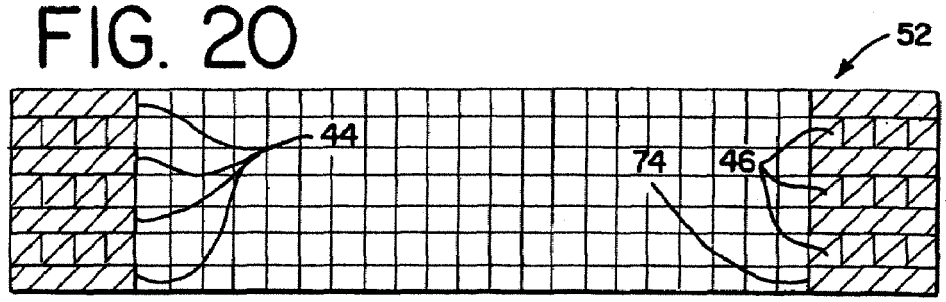
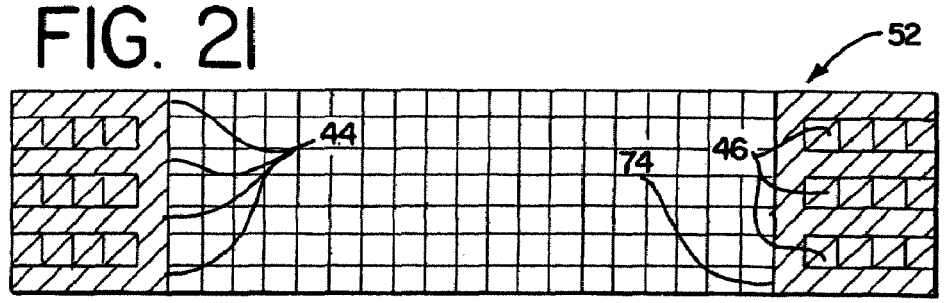
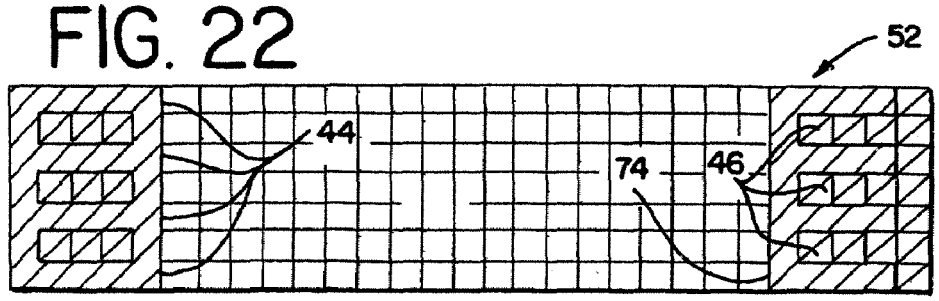

MINIATURE SILICON CONDENSER MICROPHONE

RELATED APPLICATION

This application is a continuation-in-part of U.S. application Ser. No. 11/112,043, filed Apr. 22, 2005, which is a division of U.S. application Ser. No. 09/886,854, filed Jun. 21, 2001, which claims the benefit of Provisional Patent Application Ser. No. 60/253,543 filed Nov. 28, 2000.

TECHNICAL FIELD

This patent relates generally to a housing for a transducer. More particularly, this patent relates to a miniature silicon condenser microphone comprising a housing for shielding a transducer produced on the surface of a silicon die. The silicon die must be packaged to produce a functional microphone of this type.

BACKGROUND

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

Some shielding practices have been used to house these devices. For instance, insulated metal cans or discs have been provided. Additionally, DIPS and small outline integrated circuit (SOIC) packages have been utilized. However, the drawbacks associated with manufacturing these housings, such as lead time, cost, and tooling, make these options undesirable.

SUMMARY

This patent is directed to a silicon condenser microphone package that allows acoustic energy to contact a transducer to provide the necessary pressure reference while at the same time protects the transducer from light, electromagnetic interference, and physical damage. A silicon condenser microphone package may comprise a transducer, a substrate, and a cover. The substrate has an upper surface with a recess formed therein. The transducer is attached to the upper surface of the substrate and overlaps at least a portion of the recess so that a back volume of the transducer is formed between the transducer and the substrate. The cover is placed over the transducer and includes an aperture adapted for allowing sound waves to reach the silicon condenser transducer.

Other features and advantages of the invention will be apparent from the following specification taken in conjunction with the following drawings.

BRIEF DESCRIPTION OF THE DRAWINGS

FIG. 4 is a cross-sectional view of the third embodiment affixed to an end user circuit board;

FIG. 5 is a cross-sectional view of the third embodiment affixed to an end user circuit board in an alternate fashion;

FIG. 6 is a plan view of a substrate to which a silicon condenser microphone is fixed;

FIG. 7 is a longitudinal cross-sectional view of a microphone package;

FIG. 8 is a lateral cross-sectional view of a microphone package;

FIG. 14b is a plan view of a layer of the laminated bottom portion of FIG. 14a;

FIG. 14c is a plan view of a layer of the laminated bottom portion of FIG. 14a;

FIG. 14d is a plan view of a layer of the laminated bottom portion of FIG. 14a;

FIG. 15 is a cross-sectional view of a bottom portion for a microphone package;

FIG. 16 is a cross-sectional view of a bottom portion for a microphone package;

FIG. 17 is a cross-sectional view of a bottom portion for a microphone package;

FIG. 18 is a cross-sectional view of a bottom portion for a microphone package;

FIG. 19 is a plan view of a side portion for a microphone package;

FIG. 20 is a cross-sectional package view of a side portion for a microphone package;

FIG. 21 is a cross-sectional view of a side portion for a microphone package;

FIG. 22 is a cross-sectional view of a side portion for a microphone package;

DETAILED DESCRIPTION

Figure 1:
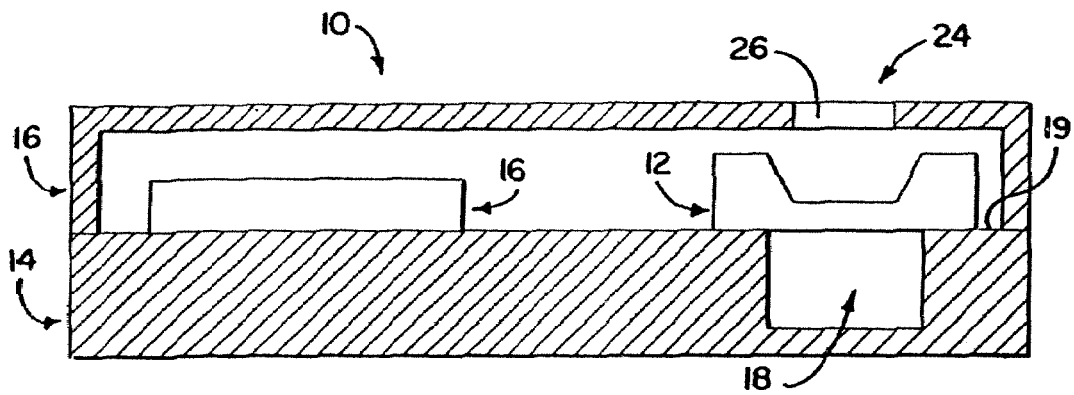
FIG. 1 is a cross-sectional view of a first embodiment of a silicon condenser microphone.

While the herein described invention is susceptible of embodiments in many different forms, there is shown in the drawings and will herein be described in detail various embodiments of the invention with the understanding that the present disclosure is to be considered as an exemplification of the principles of the invention and is not intended to limit the broad aspect of the invention to the embodiments illustrated.

This patent is directed to microphone packages. Among the many benefits of the microphone packages disclosed herein over microphone packaging utilizing plastic body/lead frames is the ability to process packages in panel form allowing more units to be formed per operation and at much lower cost. The typical lead frame for a similarly functioning package would contain between 40 and 100 devices connected together. The present disclosure may have as many as 14,000 devices connected together (as a panel). Also, the embodiments disclosed herein require minimal "hard-tooling." This allows the process to adjust to custom layout requirements without having to redesign mold, lead frame, and trim/form tooling.

Moreover, these embodiments have a better match of thermal coefficients of expansion with the end user's PCB since this part would typically be mounted on FR-4 which is the same material used by end users. The present designs may also eliminate the need for wire bonding that is required in plastic body/lead frame packages. The foot print is typically smaller than that would be required for a plastic body/lead frame design since the leads are formed by plating a through-hole in a circuit board of which one half will eventually form the pathway to the solder pad. In a typical plastic body/lead frame design, a gull in which the leads are disposed, widen the overall foot print.

Figure 2:
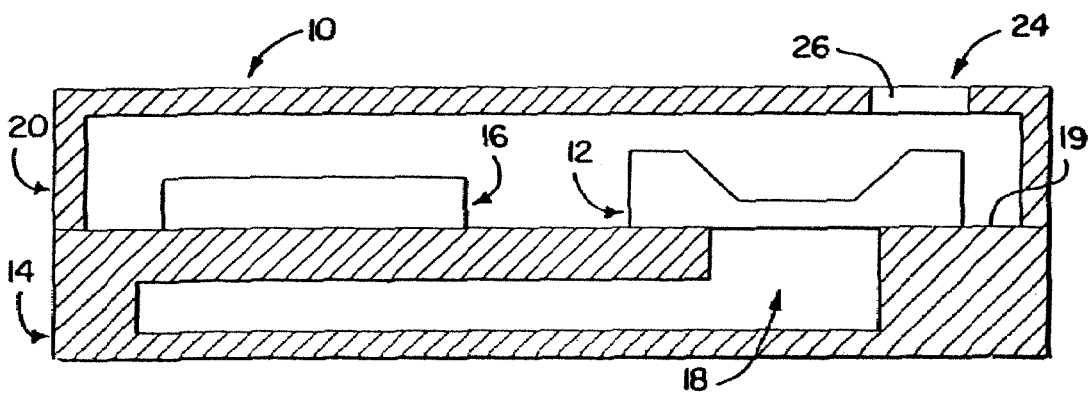
FIG. 2 is a cross-sectional view of a second embodiment of a silicon condenser microphone.
Figure 3:
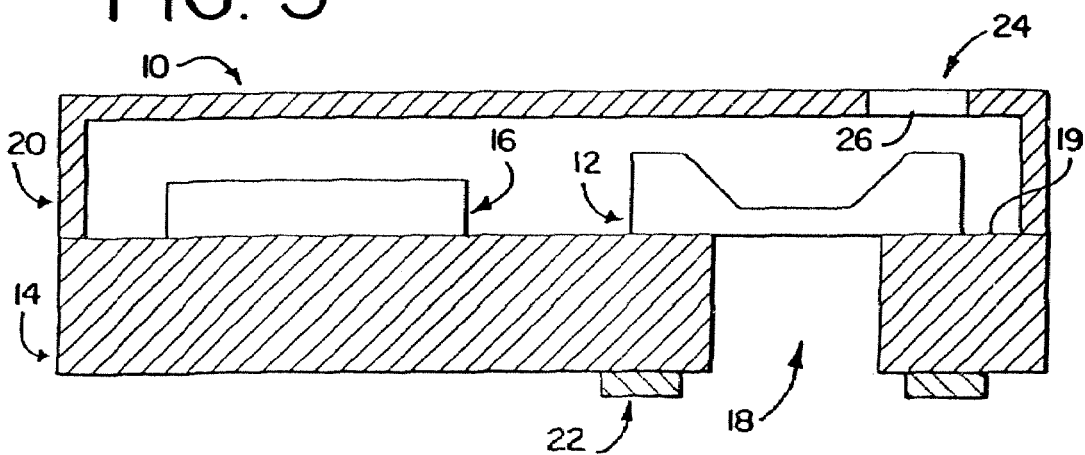
FIG. 3 is a cross-sectional view of a third embodiment of a silicon condenser microphone.
Figure 9:
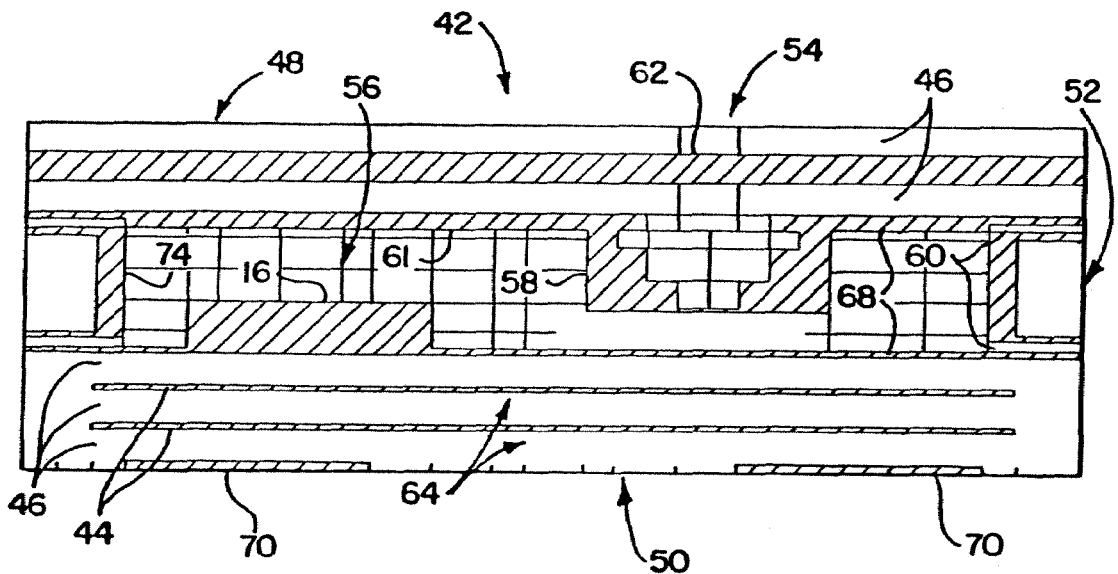
FIG. 9 is a longitudinal cross-sectional view of a microphone package.
Figure 10:
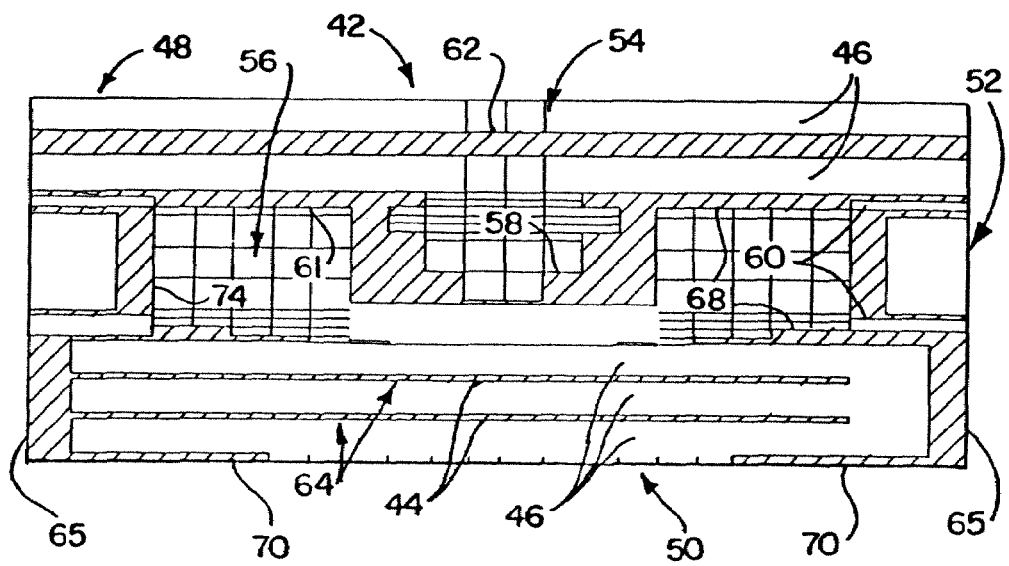
FIG. 10 is a lateral cross-sectional view of a microphone package.

Now, referring to FIGS. 1-3, three embodiments of a silicon condenser microphone package 10 are illustrated. The silicon microphone package 10 generally comprises a transducer 12, e.g. a silicon condenser microphone as disclosed in U.S. Pat. No. 5,870,482 which is hereby incorporated by reference, a substrate 14, an amplifier 16, a back volume or air cavity 18 which provides a pressure reference for the transducer 12, and a cover 20. The substrate 14 is typically formed of FR-4 material which may be processed in circuit board panel form, thus taking advantage of economies of scale in manufacturing. FIG. 6 is a plan view of the substrate 14 showing the back volume 18 surrounded a plurality of terminal pads.

The back volume 18 may be formed by a number of methods, including controlled depth drilling of an upper surface 19 of the substrate 14 to form a recess over which the silicon condenser microphone is mounted (FIG. 1); drilling and routing of several individual sheets of FR-4 and laminating the individual sheets to form the back volume 18 which may or may not have internal support posts (FIG. 2); or drilling completely through the substrate 14 and providing a sealing ring 22 on the bottom of the device that will seal the back volume 18 during surface mounting to a user's "board" 28 (FIGS. 3-5). In this example, the combination of the substrate and the user's board 28 creates the back volume 18. The back volume 18 is covered by the transducer 12 (MEMS device) which is "bumpbonded" and mounted face down. The boundary is sealed such that the back volume 18 is "air-tight".

The cover 20 is attached for protection and processibility. The cover 20 contains an aperture 24 which may contain a sintered metal insert 26 to prevent water, particles and/or light from entering the package and damaging the internal components inside; i.e. semiconductor chips. The aperture 24 is adapted for allowing sound waves to reach the transducer 12.

Referring to FIGS. 4 and 5, the final form of the product (shown without the cover 20) is a silicon condenser microphone package 10 which would most likely be attached to a end user's PCS 28 via a solder reflow process. FIG. 5 illustrates a method of enlarging the back volume 18 by including a chamber 32 within the end user's circuit board 28.

Another embodiment of a silicon condenser microphone package 40 is illustrated in FIGS. 7-10. In this embodiment, a housing 42 is formed from layers of materials, such as those used in providing circuit boards. Accordingly, the housing 42 generally comprises alternating layers of conductive and non-conductive materials 44, 46. The non-conductive layers 46 are typically FR-4 board. The conductive layers 44 are typically copper.

In the embodiment illustrated, the housing 42 includes a top portion 48 and a bottom portion 50 spaced by a side portion 52. The housing 42 further includes an aperture or acoustic port 54 for receiving an acoustic signal and an inner chamber 56 which is adapted for housing a transducer unit 58, typically a silicon die microphone or a ball grid array package (BGA). The top, bottom, and side portions 48, 50, 52 are electrically connected, for example with a conductive adhesive 60. Each portion may comprise alternating conductive and non-conductive layers of 44, 46.

The chamber 56 includes an inner lining 61. The inner lining 61 is primarily formed by conductive material. It should be understood that the inner lining may include portions of non-conductive material, as the conductive material may not fully cover the non-conductive material. The inner lining 61 protects the transducer 58 against electromagnetic interference and the like, much like a faraday cage.

In the various embodiments illustrated in FIGS. 7-10 and 23-26, the portions of the housing 42 that include the aperture or acoustic port 54 further include a layer of material that forms an environmental barrier 62 over or within the aperture 54. This environmental barrier 62 is typically a polymeric material formed to a film, such as a polytetrafluoroethylene (PTFE) or a sintered metal. The environmental barrier 62 is supplied for protecting the chamber 56 of the housing 42, consequently, the transducer unit 58 within the housing 42, from environmental elements such as sunlight, moisture, oil, dirt, and/or dust.

The environmental barrier layer 62 is generally sealed between two layers of conductive material 44. When the environmental barrier layer 62 is sandwiched between two layers of conductive material 44, it may act as a capacitor (with electrodes defined by the metal) that can be used to filter input and output signals or the input power. The environmental barrier layer 62 may further serve as a dielectric protective layer when in contact with the conductive layers 44 in the event that the conductive layers also contain thin film passive devices such as resistors and capacitors.

In addition to protecting the chamber 56 from environmental elements, the barrier layer 62 allows subsequent wet processing, board washing of the external portions of the housing 42, and electrical connection to ground from the walls via thru hole plating. The environmental barrier layer 62 also allows the order of manufacturing steps in the fabrication of the printed circuit board-based package to be modified. This advantage can be used to accommodate different termination styles. For example, a double sided package can be fabricated having a pair of apertures 54 (see FIG. 25), both including an environmental barrier layer 62. The package would look and act the same whether it is mounted face up or face down, or the package could be mounted to provide directional microphone characteristics.

Figure 11:
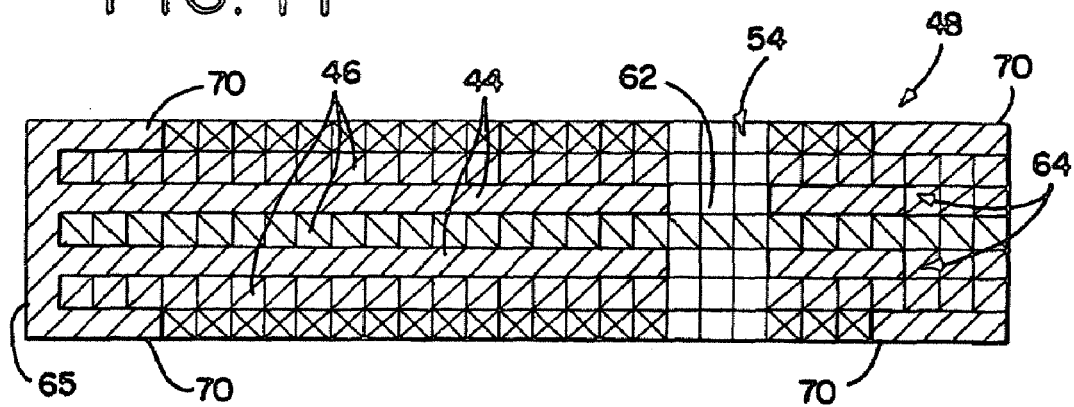
FIG. 11 is a cross-sectional view of a top portion for a microphone package.
Figure 12:
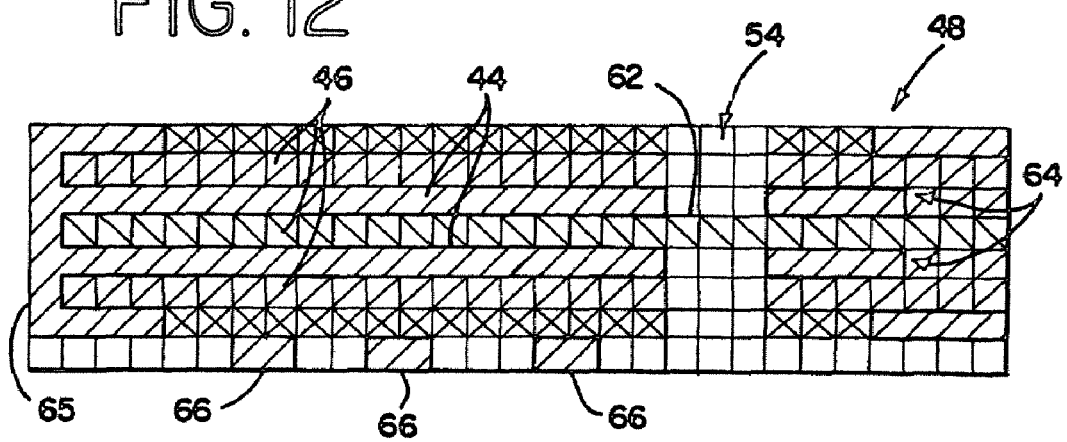
FIG. 12 is a cross-sectional view of a top portion for a microphone package.
Figure 13:
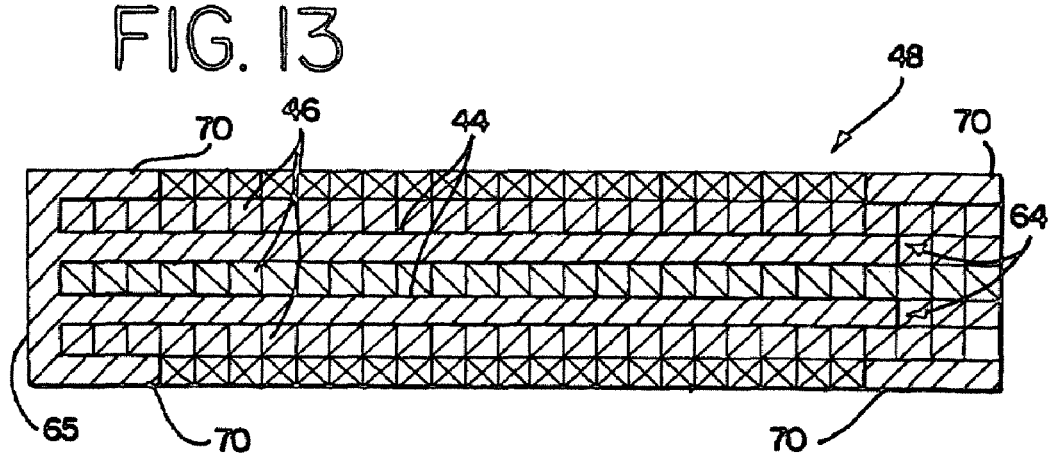
FIG. 13 is a cross-sectional view of a top portion for a microphone package.

Referring to FIGS. 7, 8, and 11-13, the transducer unit 58 is generally not mounted to the top portion 48 of the housing. This definition is independent of the final mounting orientation to an end user's circuit board. It is possible for the top portion 48 to be mounted face down depending on the orientation of the transducer 58 as well as the choice for the bottom portion 50. The conductive layers 44 of the top portion 48 may be patterned to form circuitry, ground planes, solder pads, ground pads, and plated through hole pads. Referring to FIGS. 11-13, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

FIG. 11 illustrates an alternative top portion 48 for a microphone package. In this embodiment, a connection between the layers can be formed to provide a conduit to ground. The top portion of FIG. 11 includes ground planes and/or pattern circuitry 64 and the environmental barrier 62. The ground planes and or pattern circuitry 64 are connected by pins 65.

FIG. 12 illustrates another embodiment of a top portion 48. In addition to the connection between layers, ground planes/pattern circuitry 64, and the environmental barrier 62, this embodiment includes conductive bumps 66 (e.g. Pb/Sn or Ni/Au) patterned on the bottom side to allow secondary electrical contact to the transducer 58. Here, conductive circuitry would be patterned such that electrical connection between the bumps 66 and a plated through hole termination is made.

FIG. 13 illustrates yet another embodiment of the top portion 48. In this embodiment, the top portion 48 does not include an aperture or acoustic port 54.

Referring to FIGS. 7, 8 and 14-18, the bottom portion 50 is the component of the package to which the transducer 58 is primarily mounted. This definition is independent of the final mounting orientation to the end user's circuit board. It is possible for the bottom portion 50 to be mounted facing upwardly depending on the mounting orientation of the transducer 58 as well as the choice for the top portion 48 construction. Like the top portion 48, the conductive layers 44 of the bottom portion 50 may be patterned to form circuitry, ground planes, solder pads, ground pads and plated through hole pads. As shown in FIGS. 14-18, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 14A:
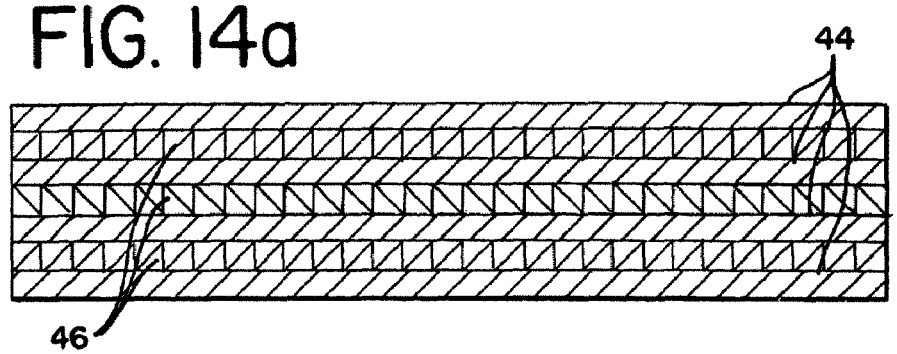
FIG. 14a is a cross-sectional view of a laminated bottom portion of a housing for a microphone package.
Figure 14B:
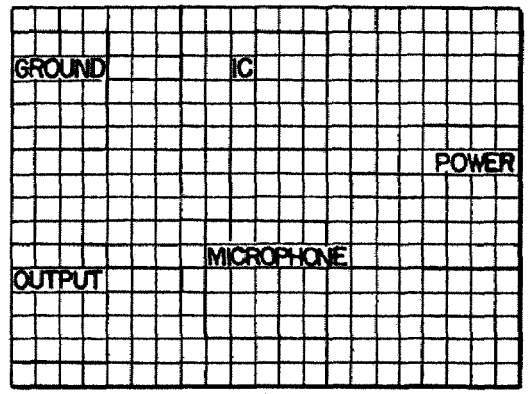

Referring to FIGS. 14a through 14d, the bottom portion 50 comprises a laminated, multi-layered board including layers of conductive material 44 deposited on layers of non-conductive material 46. Referring to FIG. 14b, the first layer of conductive material is used to attach wire bonds or flip chip bonds. This layer includes etched portions to define lead pads, bond pads, and ground pads. The pads would have holes drilled through them to allow the formation of plated through-holes.

Figure 14C:
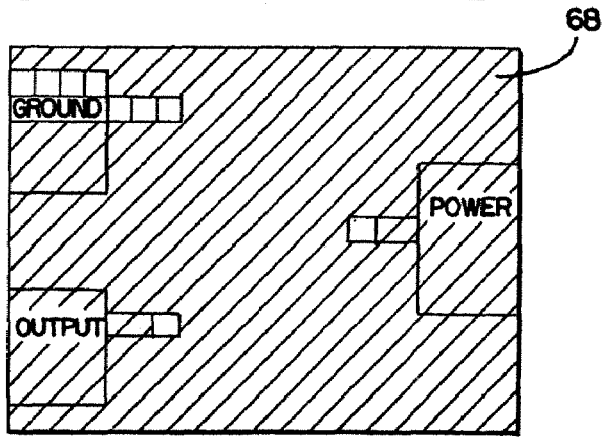

As shown in FIG. 14c, a dry film 68 of non-conductive material covers the conductive material. This illustration shows the exposed bonding pads as well as an exposed ground pad. The exposed ground pad would come in electrical contact with the conductive epoxy and form the connection to ground of the side portion 52 and the base portion 50.

Figure 14D:
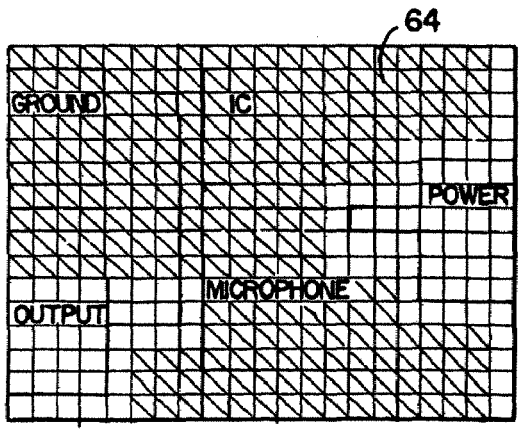

Referring to FIG. 14d, ground layers can be embedded within the base portion 50. The hatched area represents a typical ground plane 64. The ground planes do not overlap the power or output pads, but will overlap the transducer 58.

Referring to FIG. 15, an embodiment of the bottom portion 50 is illustrated. The bottom portion 50 of this embodiment includes a solder mask layer 68 and alternating layers of conductive and non-conductive material 44, 46. The bottom portion further comprises solder pads 70 for electrical connection to an end user's board.

FIGS. 16 and 17 illustrate embodiments of the bottom portion 50 with enlarged back volumes 18. These embodiments illustrate formation of the back volume 18 using the conductive/non-conductive layering.

FIG. 18 shows yet another embodiment of the bottom portion 50. In this embodiment, the back portion 50 includes the acoustic port 54 and the environmental barrier 62.

Referring to FIGS. 7-10 and 19-22, the side portion 52 is the component of the package that joins the bottom portion 50 and the top portion 48. The side portion 51 may include a single layer of a non-conductive material 46 sandwiched between two layers of conducive material 44. The side portion 48 forms the internal height of the chamber 56 that houses the transducer 58. The side portion 52 is generally formed by one or more layers of circuit board material, each having a routed window 72 (see FIG. 18).

Referring to FIGS. 19-22, the side portion 52 includes inner side wall 74. The inner side walls 74 are generally plated with a conductive material, typically copper, as shown in FIGS. 20 and 21. The side wall 74 are formed by the outer perimeter of me routed window 72 and coated/metallized with a conductive material.

Alternatively, the side wall 74 may be formed by many alternating layers of non-conductive material 46 and conductive material 44, each having a routed window 72 (see FIG. 19). In this case, the outer perimeter of the window 72 may not require coverage with a conductive material because the layers of conductive material 44 would provide effective shielding.

FIGS. 23-26 illustrate various embodiments of the microphone package 40. These embodiments utilize top, bottom, and side portions 48, 50, and 52 which are described above. It is contemplated that each of the top, bottom, and side portion 48, 50, 52 embodiments described above can be utilized in any combination without departing from the invention disclosed and described herein.

Figure 23:
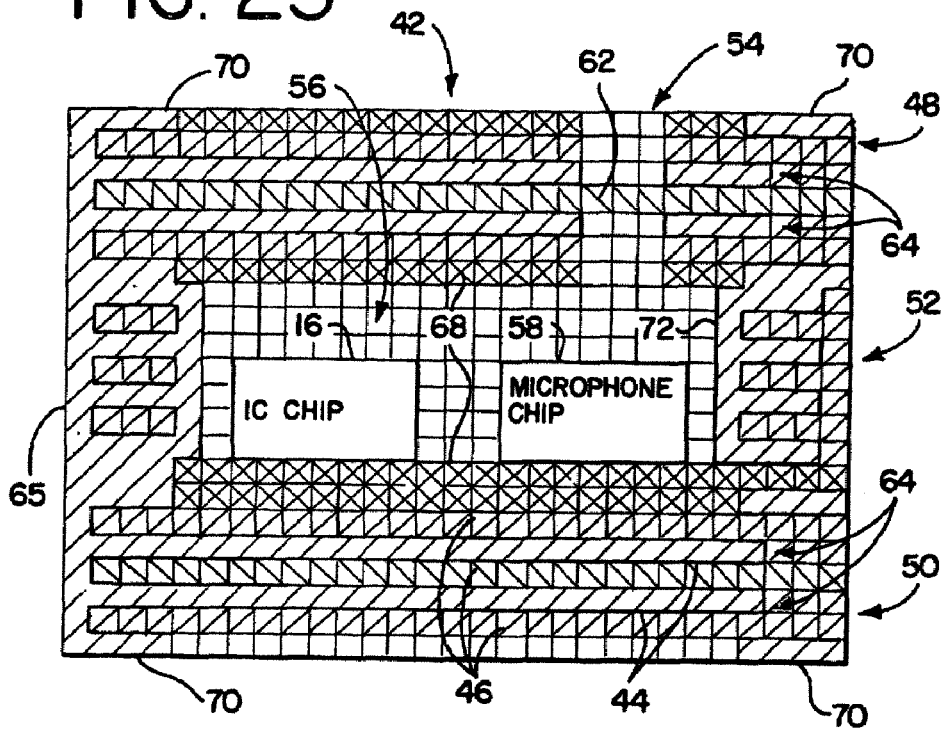
FIG. 23 is a cross-sectional view of a microphone package.

In FIG. 23, connection to an end user's board is made through the bottom portion 50. The package mounting orientation is bottom portion 50 down connection from the transducer 58 to the plated through holes is be made by wire bonding. The transducer back volume 18 is formed by the back hole (mounted down) of the silicon microphone only. Bond pads, wire bonds and traces to the terminals are not shown. A person of ordinary skilled in the art of PCB design will understand that the traces reside on the first conductor layer 44. The wire bonds from the transducer 58 are be connected to exposed pads. The pads are connected to the solder pads via plated through holes and traces on the surface.

Figure 24:
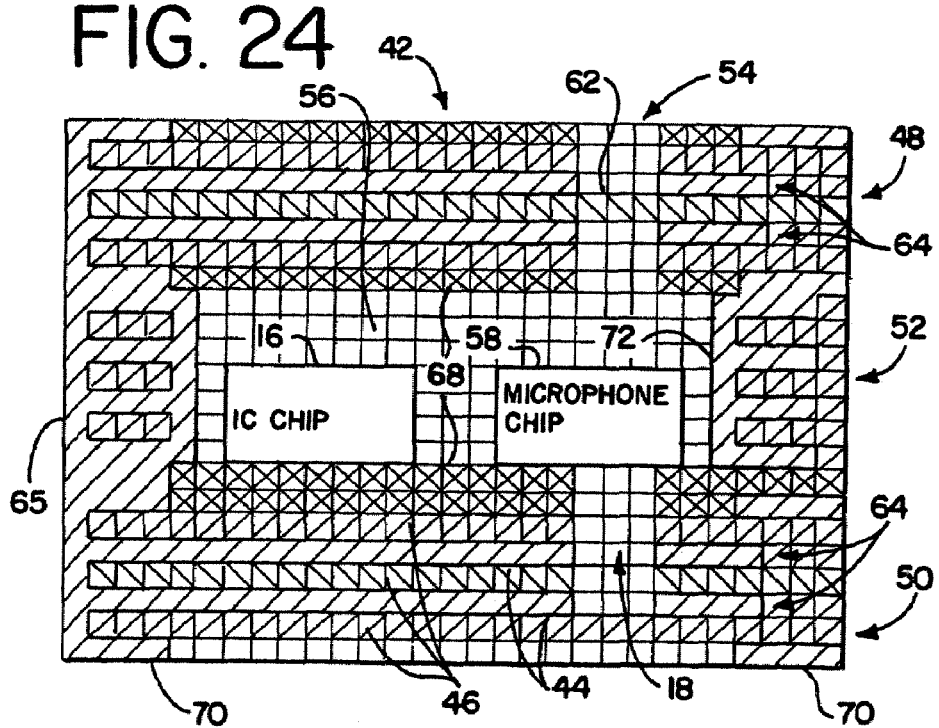
FIG. 24 is a cross-sectional view of a microphone package.

In FIG. 24, connection to the end user's board is also made through the bottom portion 50. Again, the package mounting orientation is bottom portion 50 connection from the transducer 58 to the plated through holes are made by wire bonding. The back volume 18 is formed by a combination of the back hole of the transducer 58 (mounted down) and the bottom portion 50.

Figure 25:
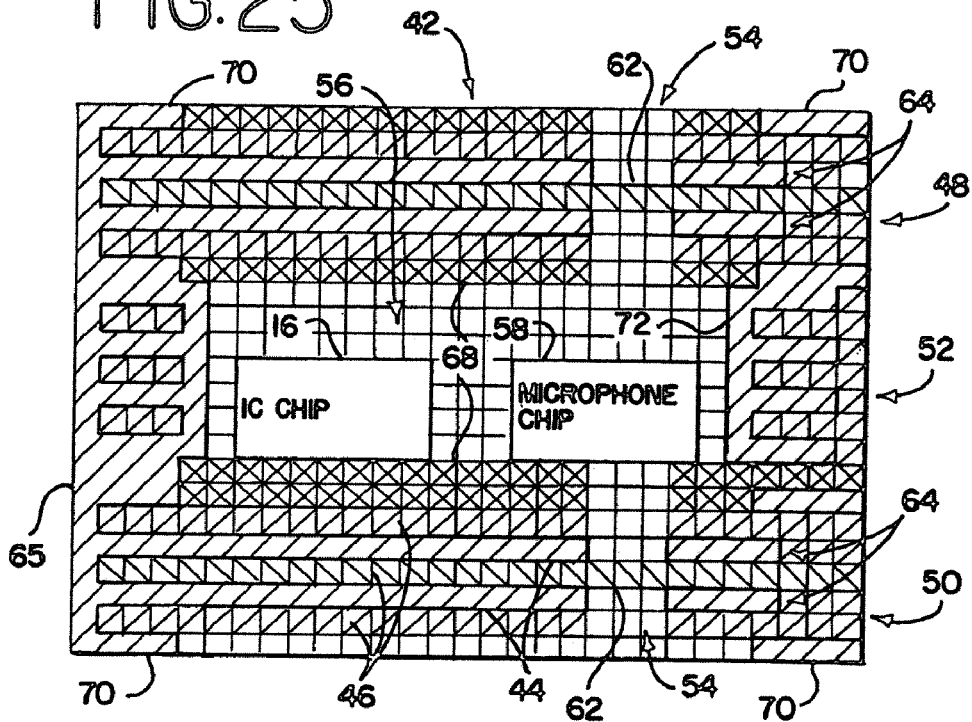
FIG. 25 is across-sectional view of a microphone package.

In FIG. 25, connection to the end user's board is also made through the bottom portion 50. Again, the package mounting orientation is bottom portion 50 connection from the transducer 58 to the plated through holes are made by wire bonding. With acoustic ports 54 on both sides of the package, there is no back volume, This method is suitable to a directional microphone.

Figure 26:
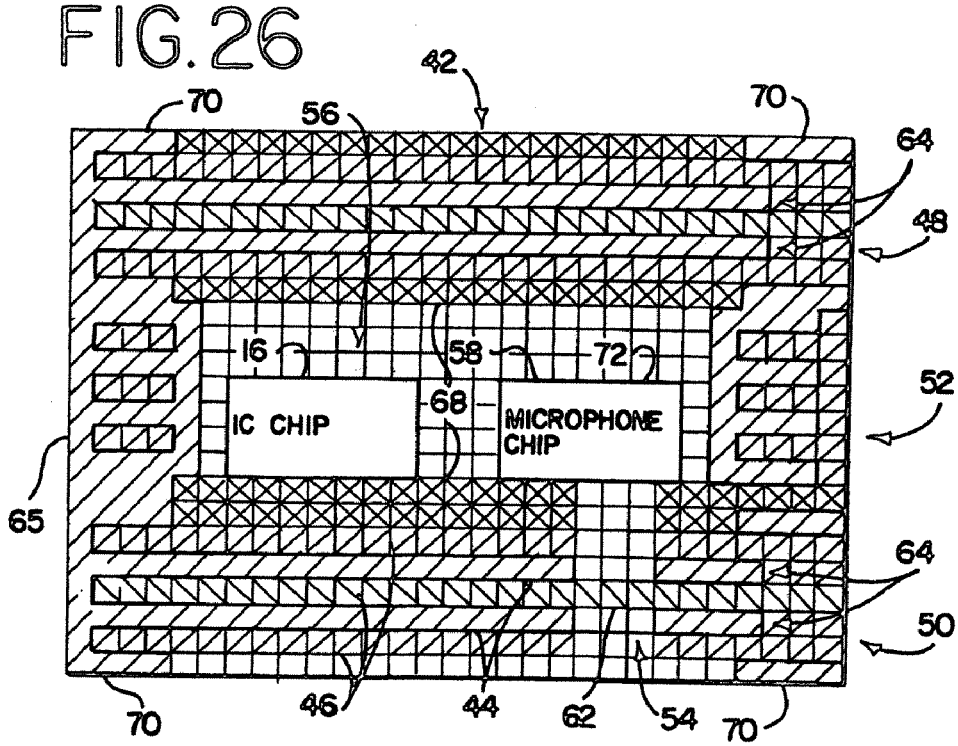
FIG. 26 is a cross-sectional view of a microphone package.

In FIG. 26, connection to the end user's board is made through the top portion 48 of the bottom portion 50. The package mounting orientation is either top portion 48 down or bottom portion 50 down. Connection from the transducer 58 to the plated through holes is made by flip chipping and trace routing. The back volume 18 is formed by using the air cavity created by laminating the bottom portion 50 and the top portion 48 together. Some portion of the package fabrication is performed after the transducer 58 has been attached. In particular, the through hole formation, plating, and solder pad definition would be done after the transducer 58 is attached. The protective membrane 62 is hydrophobic and prevents corrosive plating chemistry from entering the chamber 56.

Figure 27:
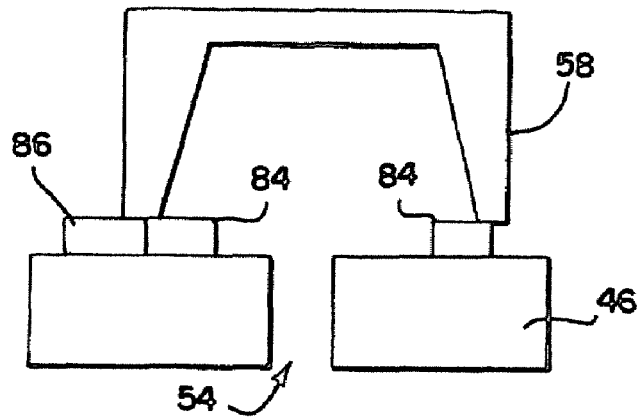
FIG. 27 is a cross-sectional view of a microphone package with a retaining ring.
Figure 28:
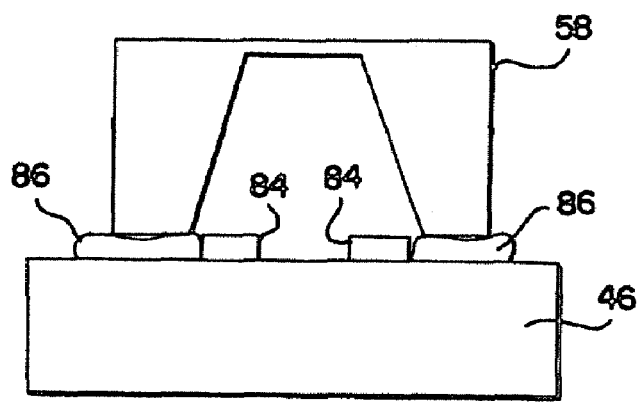
FIG. 28 is a cross-sectional view of a microphone package with a retaining wing.
Figure 29:
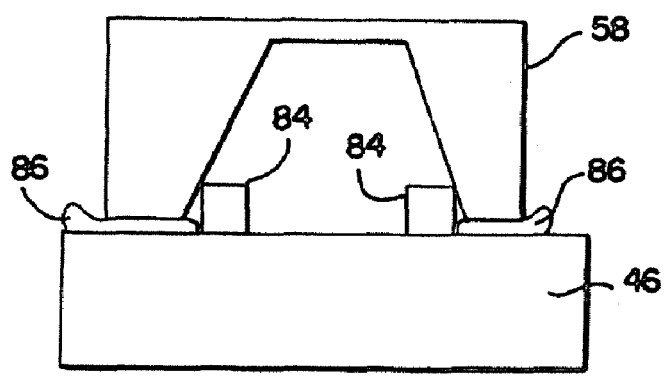
FIG. 29 is a cross-sectional view of a microphone package with a retaining ring.

Referring to FIGS. 27-29, the portion to which the transducer unit 58 is mounted may include a retaining ring 84. The retaining ring 84 prevents wicking of an epoxy 86 into the transducer 58 and from flowing into the acoustic port or aperture 54. Accordingly, the shape of the retaining ring 84 will typically match the shape of the transducer 58 foot print. The retaining ring 84 comprises a conductive material (e.g., 3 mil. thick copper) imaged on a non-conductive layer material.

Referring to FIG. 27, the retaining ring 84 is imaged onto a non-conductive layer. An epoxy is applied outside the perimeter of the retaining ring 84, and the transducer 58 is added so that it overlaps the epoxy 86 and the retaining ring 84. This reduces epoxy 86 wicking up the sides of the transducer's 58 etched port (in the case of a silicon die microphone).

Alternatively, referring to FIG. 28, the retaining ring 84 can be located so that the transducer 58 does not contact the retaining ring 84. In this embodiment, the retaining ring 84 is slightly smaller than the foot print of the transducer 58 so that the epoxy 86 has a restricted path and is, thus, less likely to wick. In FIG. 29, the retaining ring 84 is fabricated so that it contacts the etched port of the transducer 58.

Figure 30:
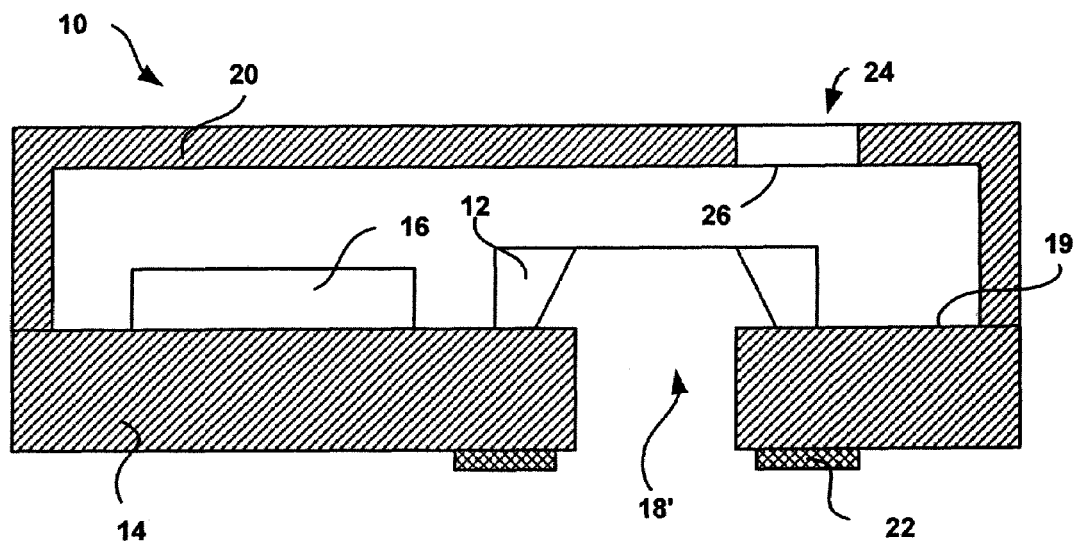
FIG. 30 is a cross-sectional view of a fourth embodiment of a silicon condenser microphone.
Figure 31:
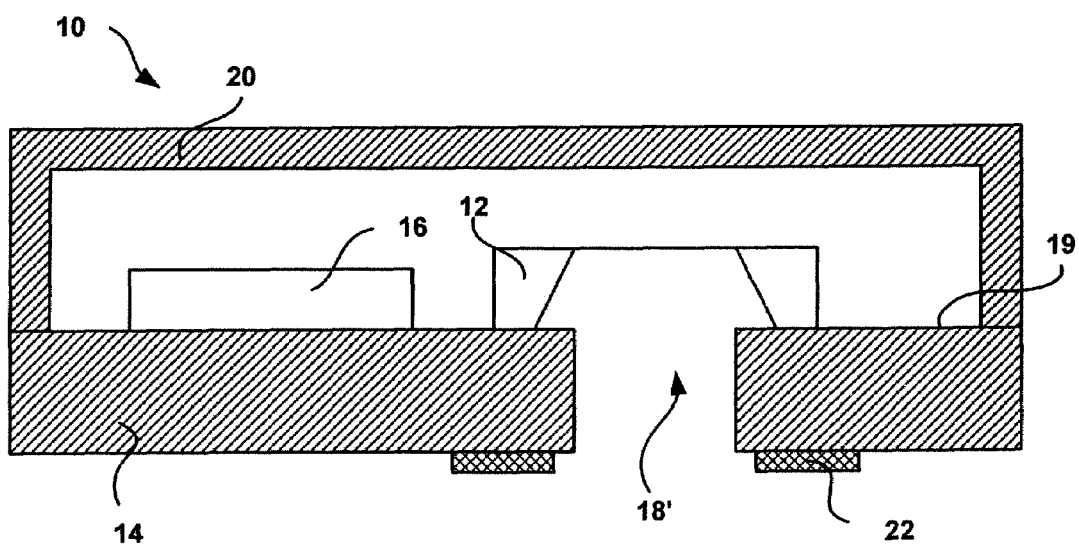
FIG. 31 is a cross-sectional view of a fifth embodiment of a silicon condenser microphone.

Referring to FIGS. 30-31, a silicon microphone package 10 for use as a directional microphone is described. In this embodiment, at least one acoustic port or aperture 18' is formed through the substrate 14 to form an acoustic path to the transducer 12. The aperture 18' may be formed by any suitable means. For example, the aperture 18' may be formed by drilling through the substrate, molding the substrate to include the aperture 18', abrasive jet cutting, or any suitable method. A second acoustic port or aperture 24 is formed on the cover 20 (see FIG. 30). The aperture 24 is optionally formed using any suitable technique or method (see FIG. 30). A layer 26 may be adhered to the cover 20 to cover the acoustic port 24. The layer 26 may serve as an environmental barrier and may further have acoustic properties to improve the frequency response of the transducer 12, create delay of the signal reaching the transducer 12 and/or facilitate providing directional response from the transducer 12. The layer 26 may be a sintered metal insert, a film, such as a PTFE film, or any suitable material that may be secured within the aperture 24 to provide the recited functionality. Acoustic ports 18' and 24 allow acoustic wave to enter the package 10. Use of both apertures 18' and 24 may provide a directional response from the transducer 12. As shown, the transducer 12 is die bonded over the acoustic pathway 18' and a sealing ring 22 may be provided on the bottom of the package 10 to seal the acoustic path 18' during surface mounting to an end user circuit board (not shown).

Figure 32:
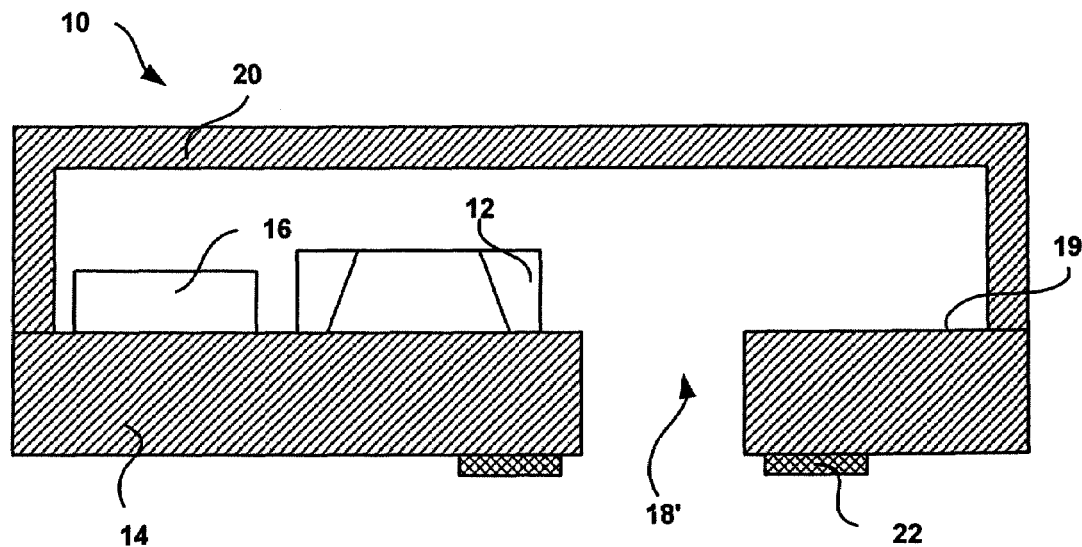
FIG. 32 is a cross-sectional view of a sixth embodiment of a silicon condenser microphone.

Alternatively, referring to FIG. 32, the transducer 12 is die bonded to the substrate 14. The acoustic pathway 18' is formed adjacent to the transducer 12. The acoustic pathway 18' again allows acoustic waves to enter the package 10 and couple to the transducer 12.

Figure 33:
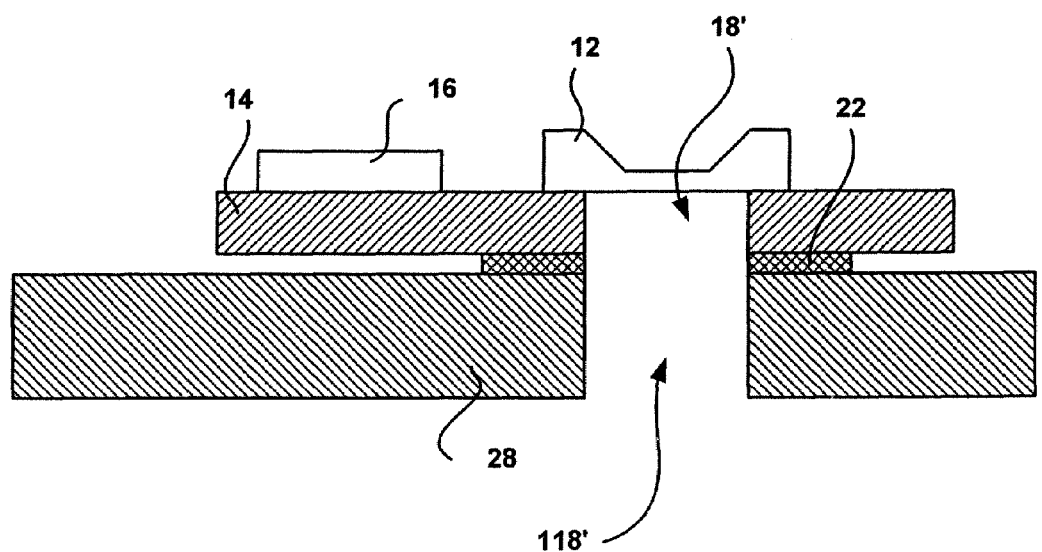
FIG. 33 is a cross-sectional view of another described embodiment of a silicon condenser microphone affixed to an end user circuit board.

Referring to FIG. 33, the package 10 (cover 20 not depicted but forming a part of the package 10) is mounted to an end user circuit board 28, for example, via a solder reflow process. A through hole may be formed in the circuit board 28 defining a passage 118. The through hole/passage 118 may be formed by any suitable method. The passage 118 in this embodiment aligns with and forms a portion of the acoustic pathway defined by aperture 18'. The package 10 is sealed over the passage 118' of the circuit board 28 via the sealing ring 22. The package 10 may be a single acoustic port microphone package or a two acoustic ports microphone package. For example, the package 10 may be a single or multiple port microphone package depending on the configuration of the cover 20, and whether it includes the aperture 24 (see FIG. 30) or not (see FIG. 31).

Figure 34:
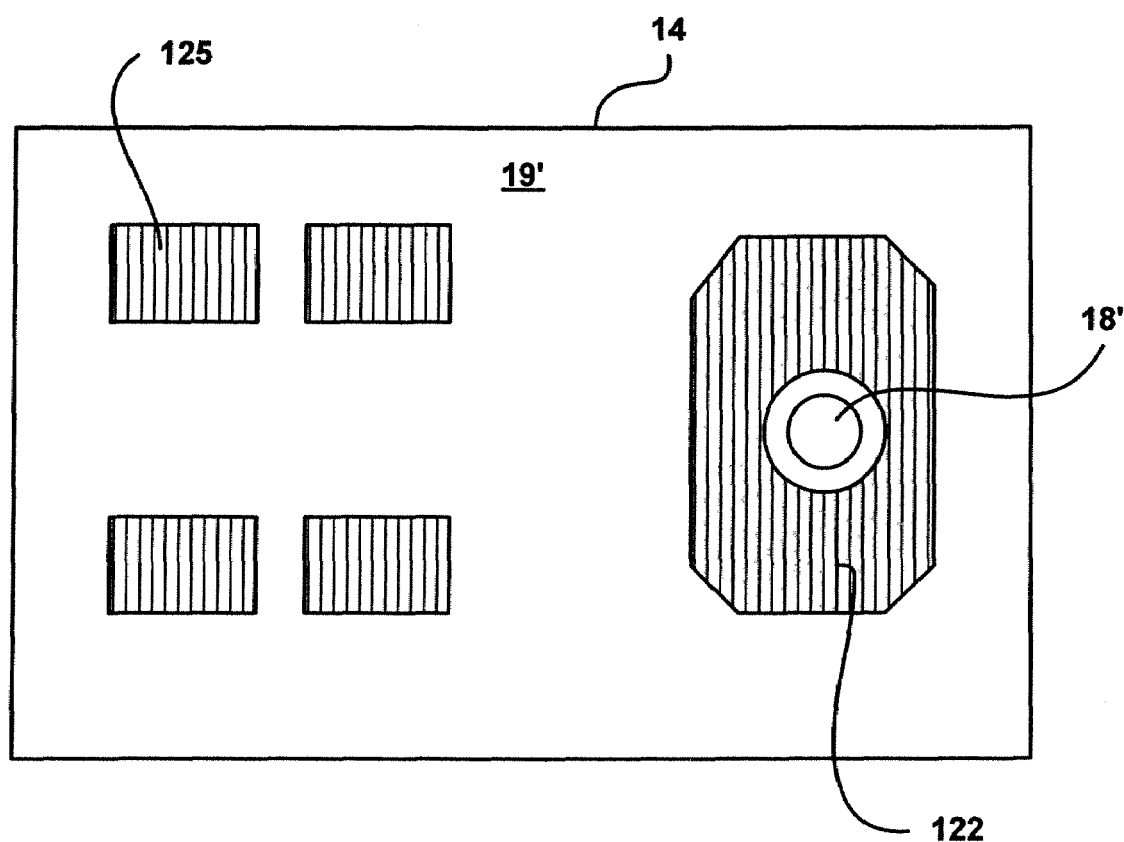
FIG. 34 is a plan view of a substrate to which a silicon condenser microphone is affixed.

Referring now to FIG. 34, a plan view of the lower surface 19' of the substrate 14 showing an acoustic pathway, for example defined by aperture 18', as described above, a metalized region 122 around the acoustic pathway, and a plurality of terminal pads 125. The terminal pads 125 and the region 122 to which the sealing ring 22 may be formed at the region 122 may soldered to the end user circuit board 28 via a solder reflow process.

The following tables provide an illustrative example of a typical circuit board processing technique for fabrication of the housing of this embodiment.

TABLE 1

Materials

| Material | Type | Component | Note |
|---|---|---|---|
| 1 | 0.5/0.5 oz. DST Cu 5 core FR-4 | Bottom Portion (Conductive Layers 1 and 2; Non-Conductive Layer 1) | |
| 2 | 0.5/0.5 oz. DST Cu 5 core FR-4 | Bottom Portion (Conductive Layers 3 and 4; Non-Conductive Layer 2) | |
| 3 | 106 pre-preg | | For Laminating Material 1 and Material 2 |
| 4 | 0.5/0.5 oz. DST Cu 40 Core FR-4 | Side Portion | Metallized Afterward |
| 5 | Bare/0.5 oz. Cu 2 core FR-4 (2 pieces) | Top Portion (Each Piece Includes 1 Conductive and 1 Non-Conductive Layer) | |
| 6 | Expanded PTFE | Environmental Barrier | |

2: Processing of Materials (Base Portion Material 1)

| Step | Type | Description | Note |
|---|---|---|---|
| 1 | Dry Film Conductive Layers | | |
| 2 | Expose | Mask Material 1 (Lower Conductive Layer) | Forms Ground Plane on Lower Conductive Layer |
| 3 | Develop | | |

-continued

2: Processing of Materials (Base Portion Material 1)

| Step | Type | Description | Note |
|---|---|---|---|
| 4 | Etch Cu | | No Etching on Upper Conductive Layer |
| 5 | Strip Dry Film | | |

TABLE 3

Processing of Materials (Bottom Portion Material 2)

| Step | Type | Description | Note |
|---|---|---|---|
| 1 | Dry Film Conductive Layers | | |
| 2 | Expose | Mask Material 2 (Upper Conductive Layer) | Forms Ground Plane on Upper Conductive Layer |
| 3 | Develop | | |
| 4 | Etch Cu | | No Etching on Lower Conductive Layer |
| 5 | Strip Dry Film | | |

TABLE 4

Processing of Materials 1, 2, and 3 (Form Bottom Portion)

| Step | Type | Description | Note |
|---|---|---|---|
| 1 | Laminate | Materials 1 and 2 Laminated Using Material 3 | |
| 2 | Drill Thru Holes | Drill Bit = 0.025 in. | |
| 3 | Direct Metallization/ Flash Copper | Plates Thru Holes | |
| 4 | Dry Film (L1 and L4) | | |
| 5 | Expose | Mask Laminated Materials 1 and 2 (Upper and Lower Conductive Layers) | Forms Traces and Solder Pads |
| 6 | Develop | | |
| 7 | Electrolytic Cu | 1.0 mil | |
| 8 | Electrolytic Sn | As Required | |
| 9 | Strip Dry Film | | |
| 10 | Etch Cu | | |
| 11 | Etch Sn | | |
| 12 | Insert Finishing Option Here | NG Option (See Table Below) | NG Option for Proof of Principle |
| 13 | Dry Film (cover Lay) on Upper Conductive Layer Only | 2.5 mil | Minimum Thickness on Upper Conductive Layer |
| 14 | Expose | Mask Laminated Materials 1 and 2 (upper and lower) | This mask defines an area on the upper conductive layer that will receive a dry film solder mask (cover lay). The bottom layer will not have dry film applied to it. The plated through holes will be bridged over by the coating on the top. |
| 15 | Develop | | |
| 16 | Cure | | Full Cure |

TABLE 4-continued

Processing of Materials 1, 2, and 3 (Form Bottom Portion)

| Step | Type | Description | Note |
|---|---|---|---|
| 17 | Route Panels | Route Bit = As Required | Forms 4" × 4" pieces. Conforms to finished Dims |

Table 5 describes the formation of the side portion 52. This process involves routing a matrix of openings in FR-4 board. However, punching is thought to be the cost effective method for manufacturing. The punching may done by punching through the entire core, or, alternatively, punching several layers of no-flow pre-preg and thin core c-stage which are then laminated to form the wall of proper thickness.

After routing the matrix, the board will have to be electroless or DM plated. Finally, the boards will have to be routed to match the bottom portion. This step can be done first or last. It may make the piece more workable to perform the final routing as a first step.

TABLE 5

Processing of Material 4 (Side Portion)

| Step | Type | Description | Note |
|---|---|---|---|
| 1 | Route./Punch Matric of Openings | Route Bit = 0.031 in. | Forms Side Portion |
| 2 | Direct Metallization/ Flash Cu | 0.25 mil minimum | Forms Sidewalls on Side Portion |
| 3 | Route Panels | | |

Table 6 describes the processing of the top portion. The formation of the top portion 48 involves imaging a dry film cover layer or liquid solder mask on the bottom (i.e. conductive layer forming the inner layer. The exposed layer of the top portion 48 will not have a copper coating. It can be processed this way through etching or purchased this way as a one sided laminate.

A matrix of holes is drilled into the lid board. Drilling may occur after the imaging step. If so, then a suitable solder mask must be chosen that can survive the drilling process.

TABLE 6

Processing of Top Portion

| Step | Type | Description | Note |
|---|---|---|---|
| 1 | Dry Film | Conductive Layer | |
| 2 | Expose | Mask Bare Layer | Form Conduction Ring |
| 3 | Develop | | |
| 4 | Cure | | |
| 5 | Drill Matrix of Holes | Drill Bit = 0.025 in. | Acoustic Ports |

TABLE 6-continued

Processing of Top Portion

| Step | Type | Description | Note |
|---|---|---|---|
| 6 | Laminate | PTFE (Environmental Barrier) Between 2 Pieces of Material 5 | Forms Top Portion |

TABLE 7

Processing of Laminated Materials 1 and 2 with Material 4

| Step | Type | Description | Note |
|---|---|---|---|
| 1 | Screen Conductive Adhesive on Material 4 | | |
| 2 | Laminate | Bottom Portion with Side Portion | Forms Bottom Portion with Side Portion (spacer) |
| 3 | Add Transducer Assembly | Silicon Die Microphone and Integrated Circuit | |

TABLE 8

Processing of Laminated Materials 1, 2, and 4 with Material 5

| Step | Type | Description | Note |
|---|---|---|---|
| 1 | Screen Conductive Adhesive on Top Portion | | |
| 2 | Laminate | Bottom Portion and Side Portion with Top Portion | Forms Housing |
| 3 | Dice | | |

TABLE 9

Finishing Option NG (Nickel/Gold)

| Step | Type | Description | Note |
|---|---|---|---|
| 1 | Immersion Ni (40-50, μ-in) | | |
| 2 | Immersion Au (25-30, μ-in) | | |

TABLE 10

Finishing Option NGT (Nickel/Gold/Tin)

| Step | Type |
|---|---|
| 1 | Mask L2 (using thick dry film or high tack dicing tape) |
| 2 | Immersion Ni (40-50, μ-in) |
| 3 | Immersion Au (25-30, μ-in) |
| 4 | Remove Mask on L2 |
| 5 | Mask L1 (using thick dry film or high tack dicing tape) bridge over cavity created by wall |
| 6 | Immersion Sn (100-250, μ-in) |
| 7 | Remove Mask on L1 |

TABLE 11

Finishing Option ST (Silver/Tin)

| Step | Type |
|---|---|
| 1 | Mask L2 (using thick dry film or high tack dicing tape) |
| 2 | Immersion Ag (40-50 μ-in) |
| 3 | Remove Mask on L2 |
| 4 | Mask L1 (using thick dry film or high tack dicing tape) bridge over cavity created by wall |
| 5 | Immersion Sri (100-250 μ-in) |
| 6 | Remove Mask on L1 |

While specific embodiments have been illustrated and described, numerous modifications come to mind without significantly departing from the spirit of the invention, and the scope of protection is only limited by the scope of the accompanying Claims.

What is claimed is:

1. A package for containing a transducer comprising:
a substrate including a surface and an aperture formed therein, the transducer attached to the surface of the substrate adjacent the aperture;
a cover secured to the substrate defining a volume, the transducer unit being disposed within the volume; and
a sealing ring being formed on a surface of the substrate opposite the volume, the sealing ring surrounding the aperture formed in the substrate.

2. The package of claim 1, wherein the transducer is attached to the substrate completely covering the aperture.

3. The package of claim 1, wherein the transducer is attached to the substrate partially covering the aperture.

4. The package of claim 1, wherein the transducer is attached to the substrate leaving the aperture uncovered.

5. The package of claim 1, the cover being formed with an aperture coupled to the volume, a layer being disposed over one or both of the apertures formed on the substrate and the cover.

6. The package of claim 5, wherein the layer has acoustic properties.

7. The package of claim 5, wherein the layer forms an environmental protective barrier.

8. The package of claim 1, the package being secured to a substrate of a device, the sealing ring providing a seal between the aperture formed in the substrate and an aperture formed in the substrate of the device.

9. The package of claim 1, a plurality of terminal pads being formed on a surface of the substrate opposite the volume, the terminal pads for providing an electrical connection between the transducer within the volume and an exterior of the package.

10. The package of claim 1, a metalized region being formed on a surface of the substrate opposite the volume, the metalized region being disposed adjacent the aperture formed in the substrate.

11. The package of claim 1, the cover including a conductive portion, the conductive portion forming a shield against electromagnetic interference.

12. The package of claim 11, the conductive portion comprising a conductive layer formed in the cover.

13. The package of claim 1, the substrate including a conductive portion, the conductive portion forming a shield against electromagnetic interference.

14. The package of claim 13, the conductive portion comprising a conductive layer formed in the substrate.

15. The package of claim 1, the cover including a first conductive portion, the substrate including a second conductive portion, the first conductive portion and the second conductive portion being electrically coupled, the first conductive portion and the second conductive portion forming a shield against electromagnetic interference.

16. The package of claim 15, the first conductive portion comprising a conductive layer formed in the cover and the second conductive portion comprising a conductive layer formed in the substrate.

17. The package of claim 1, the cover being acoustically sealed to the substrate.

18. The package of claim 1, the substrate comprising a printed circuit board.

19. The package of claim 1, an environmental barrier being disposed within the aperture formed in the substrate and in the aperture optionally formed in the cover, if present.

20. The package of claim 19, the environmental barrier comprising sintered metal.

21. The package of claim 1, the volume comprising a back volume for the transducer.

* * * * *